United States Patent
Fukami

(10) Patent No.: US 7,554,777 B2
(45) Date of Patent: Jun. 30, 2009

(54) POWER SUPPLY CONTROL APPARATUS INCLUDING CONTROL CIRCUIT CHIP WITH REVERSE-CONNECTED BATTERY PROTECTION

(75) Inventor: Ikuo Fukami, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 277 days.

(21) Appl. No.: 10/855,511

(22) Filed: May 28, 2004

(65) Prior Publication Data
US 2004/0263132 A1 Dec. 30, 2004

(30) Foreign Application Priority Data
Jun. 24, 2003 (JP) .............................. 2003-179688

(51) Int. Cl.
*H02H 7/00* (2006.01)
(52) U.S. Cl. ......................................................... 361/18
(58) Field of Classification Search ................ 320/124; 323/265, 282; 361/18, 87, 101
See application file for complete search history.

(56) References Cited

U.S. PATENT DOCUMENTS

| | | | | | |
|---|---|---|---|---|---|
| 5,301,146 | A | * | 4/1994 | Hama | .......................... 365/154 |
| 5,374,923 | A | * | 12/1994 | Sakamoto | .................... 340/654 |
| 5,517,379 | A | | 5/1996 | Williams et al. | |
| 5,869,957 | A | * | 2/1999 | Koike | .......................... 323/313 |
| 6,031,702 | A | * | 2/2000 | Williams | ..................... 361/87 |
| 6,043,965 | A | * | 3/2000 | Hazelton et al. | ............... 361/84 |
| 6,313,610 | B1 | * | 11/2001 | Korsunsky | ................... 320/134 |
| 6,380,793 | B1 | * | 4/2002 | Bancal et al. | ................ 327/427 |
| 6,614,666 | B1 | * | 9/2003 | Chen et al. | ..................... 363/20 |
| 6,650,520 | B2 | * | 11/2003 | He | .............................. 361/84 |
| 6,859,020 | B2 | * | 2/2005 | Baldwin et al. | ............. 323/283 |
| 2003/0128569 | A1 | * | 7/2003 | Chen et al. | ................... 365/145 |
| 2004/0160350 | A1 | * | 8/2004 | Lu | .............................. 341/154 |

FOREIGN PATENT DOCUMENTS

JP 8-213619 8/1996

OTHER PUBLICATIONS

Infineon Technologies AG, "Smart Highside Power Switch" of Profet Data Sheet BTS 6143D, pp. 1-16, Aug. 7, 2002.

* cited by examiner

*Primary Examiner*—Adolf Berhane
(74) *Attorney, Agent, or Firm*—McGinn IP Law Group, PLLC

(57) ABSTRACT

In a power supply control apparatus for controlling supplying of power from a battery to a load, a power supply switch circuit chip is connected to the load, to turn ON and OFF a connection between the battery and the load. A control circuit chip is powered by the battery to control the power supply switch circuit chip. The control circuit chip is constructed by an internal circuit for controlling the power supply switch circuit chip, a parasitic diode connected in parallel to the internal circuit, and a depletion type MOS transistor connected in series to the internal circuit. Diode characteristics of the parasitic diode and the depletion type MOS transistor are opposite to each other with respect to the battery. That is, in a forward-connected battery state, the parasitic diode and the depletion type MOS transistor are reverse-biased and forward-biased, respectively. In a reverse-connected battery state, the parasitic diode and the depletion type MOS transistor are forward-biased and reverse-biased, respectively.

4 Claims, 9 Drawing Sheets ions invention will be more clearly understood

POWER SUPPLY CONTROL APPARATUS INCLUDING CONTROL CIRCUIT CHIP WITH REVERSE-CONNECTED BATTERY PROTECTION

DESCRIPTION OF THE INVENTION

1. Field of the Invention

The present invention relates to a power supply control apparatus including a control circuit chip for controlling a power supply switch circuit chip for connecting a battery to a load in a motor vehicle.

2. Description of the Related Art

A prior art power supply control apparatus is constructed by a power supply switch circuit chip for connecting a battery to a load and a control circuit chip for controlling the power supply switch circuit chip. The power supply switch circuit chip includes a power MOS transistor. On the other hand, the control circuit chip includes an internal circuit formed by a logic circuit and a charge pump circuit, a parasitic diode (an electrostatic discharge protection circuit) in parallel with the internal circuit for operating the internal circuit in a forward-connected battery state, and a polycrystalline silicon resistor connected in series with the parasitic diode for limiting a current flowing through the internal circuit in a reverse-connected battery state (see: Infineon Technologies AG, "Smart Highside Power Switch" of PROFET Data sheet BTS 6143D, page 1 of 16, Aug. 7, 2002). This will be explained later in detail.

In the above-described prior art power supply control apparatus, however, since the polycrystalline silicon resistor is manufactured by a chemical vapor deposition (CVD) process, the resistance value of the polycrystalline silicon resistor cannot be increased. As a result, a large amount of current flows through the internal circuit in a reverse-connected battery state, so that the internal circuit would be overheated and damaged.

In the case of U.S. Pat. No. 5,517,379, since the power MOS transistor is manufactured by a vertical MOS process while the internal circuit is manufactured by a CMOS process, it is difficult to integrate the power MOS transistor into the control circuit chip. Also, a circuit required for controlling the power MOS transistor is very complex, which would increase the manufacturing cost.

Also, a Schottkey barrier diode or a depletion type MOS transistor is provided to protect the load in a reverse-connected battery state (see: JP-A-8-213619). However, such a Schottkey barrier diode or a depletion type MOS transistor cannot protect the internal circuit of the control circuit chip in a reverse-connected battery state.

SUMMARY OF THE INVENTION

It is an object of the present invention to provide a power supply control apparatus capable of effectively protecting an internal circuit in a reverse-connected battery state.

Another object is to provide a control circuit chip used in such a power supply control apparatus.

According to the present invention, in a power supply control apparatus for controlling supplying of power from a battery to a load, a power supply switch circuit chip is connected to the load to turn ON and OFF connection between the battery and the load. A control circuit chip is powered by the battery to control the power supply switch circuit chip. The control circuit chip is constructed by an internal circuit for controlling the power supply switch circuit chip, a parasitic diode connected in parallel to the internal circuit, and a depletion type MOS transistor connected in series to the internal circuit. The diode characteristics of the parasitic diode and the depletion type MOS transistor are opposite to each other with respect to the battery. In a forward-connected battery state, the parasitic diode and the depletion type MOS transistor are reverse-biased and forward-biased, respectively. In a reverse-connected battery state, the parasitic diode and the depletion type MOS transistor are forward-biased and reverse-biased, respectively.

BRIEF DESCRIPTION OF THE DRAWINGS

The present invention will be more clearly understood form the description set forth below, as compared with the prior art, with reference to the accompanying drawings, wherein.

DESCRIPTION OF THE PREFERRED EMBODIMENTS

Before the description of the preferred embodiments, a prior art power supply control apparatus will be explained with reference to FIG. 1 (see: Infineon Technology AG, "Smart Highside Power Switch" of PROFET Data Sheet BTS 6143D, page 1 of 16, Aug. 7, 2002).

Figure 1:
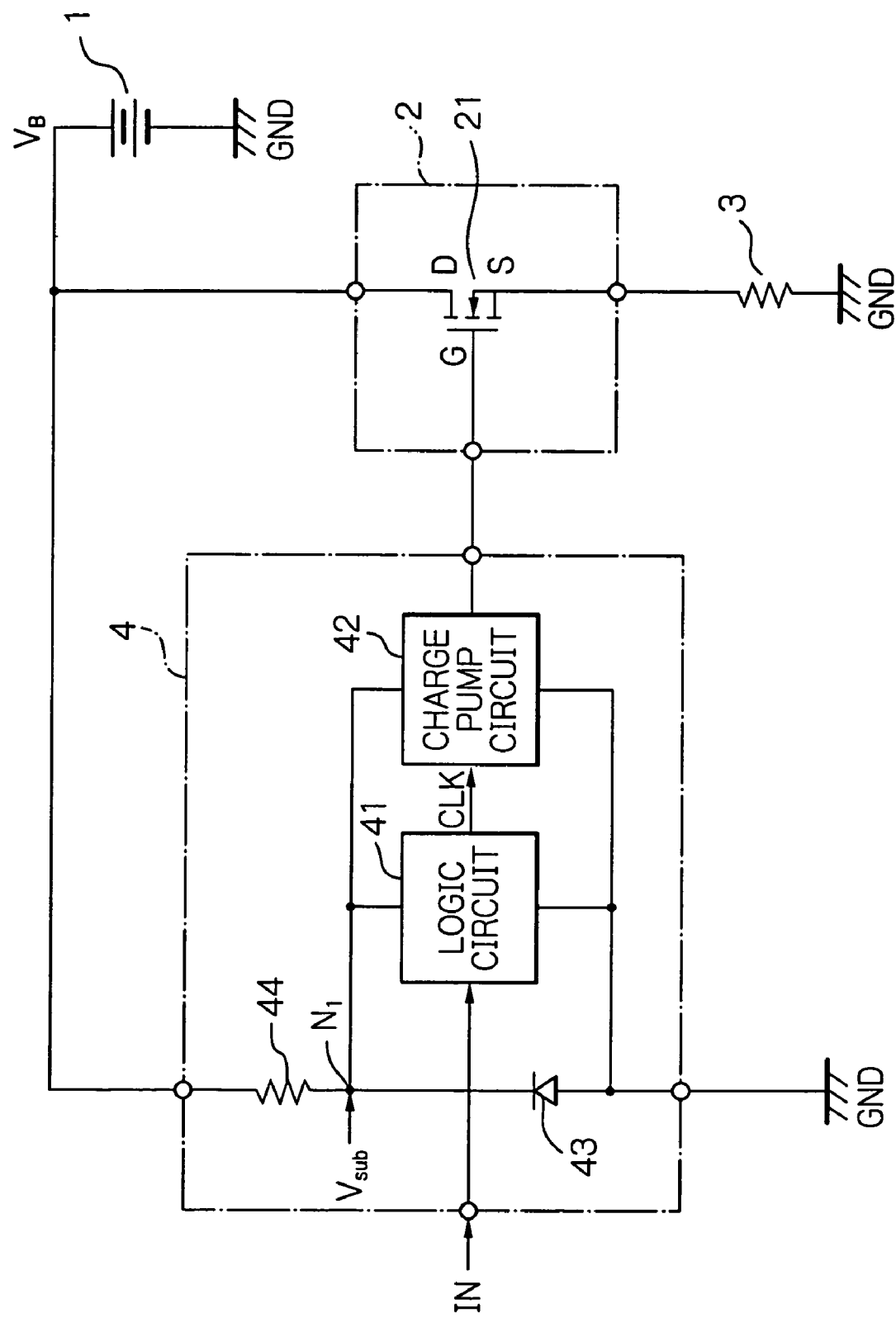
FIG. 1 is a circuit diagram illustrating a prior art power supply control apparatus.

In FIG. 1, a battery 1 whose voltage is denoted by VB is connected via a power supply switch circuit 2 to a load 3 such as a starter, a lamp or the like. In this case, the power supply switch circuit 2 is constructed by a semiconductor chip including an N-channel power MOS transistor 21 which has a drain D connected to the battery 1, a source S connected to the load 3, and a gate connected to a control circuit 4.

The control circuit 4 is constructed by another semiconductor chip including a logic circuit 41 powered by the battery voltage $V_B$ for receiving an input signal IN to generate a clock signal CLK, a charge pump circuit 42 powered by the battery voltage $V_B$ to receive the clock signal CLK and turn ON the power MOS transistor 21, a parasitic diode 43 serving as an electrostatic discharge diode (ESD), and a resistor 44 made of polycrystalline silicon.

In a forward-connected battery state, since the parasitic diode 43 is reverse-biased, the parasitic diode 43 can protect the logic circuit 41 and the charge pump circuit 42 from an over voltage of the battery voltage $V_B$.

On the other hand, in a reverse-connected battery state, since the parasitic diode 43 is forward-biased, the parasitic diode 43 cannot protect the logic circuit 41 and the charge pump circuit 42 from a reversed voltage of the battery voltage $V_B$. In this case, since the resistor 44 limits a total current flowing through the logic circuit 41, the charge pump circuit 42 and the parasitic diode 43, the resistor 44 would protect the logic circuit 41 and the charge pump circuit 42 from a reversed voltage of the battery voltage $V_B$.

In FIG. 1, note that a substrate voltage $V_{sub}$ is applied to a node $N_1$ between the parasitic diode 43 and the resistor 44, to stably operate the control circuit 4 without inviting a latch-up phenomenon, for example.

Also, note that the power supply switch circuit 2 is manufactured by a vertical MOS process while the control circuit 4 is manufactured by a CMOS process, (see: U.S. Pat. No. 5,517,379). Therefore, it is difficult to integrate the power supply switch circuit 2 and the control circuit 4 into one semiconductor chip.

In FIG. 1, however, since the resistor 44 is made of polycrystalline silicon deposited by a CVD process, the resistance value of the resistor 44 cannot be increased. For example, the resistance value of the resistor 44 is 100 Ω at the largest. In this case, if the battery voltage $V_B$ is 12V and the voltage drop of the parasitic diode 43 is 1V, a current of about 110 mA (=(12−1)/100) flows through the logic circuit 41 and the charge pump circuit 42 in a reverse-connected battery stage. As a result, if such a current flows for a long time period such as 1 minute, the logic circuit 41 and the charge pump circuit 42 would be overheated and damaged.

Figure 2:
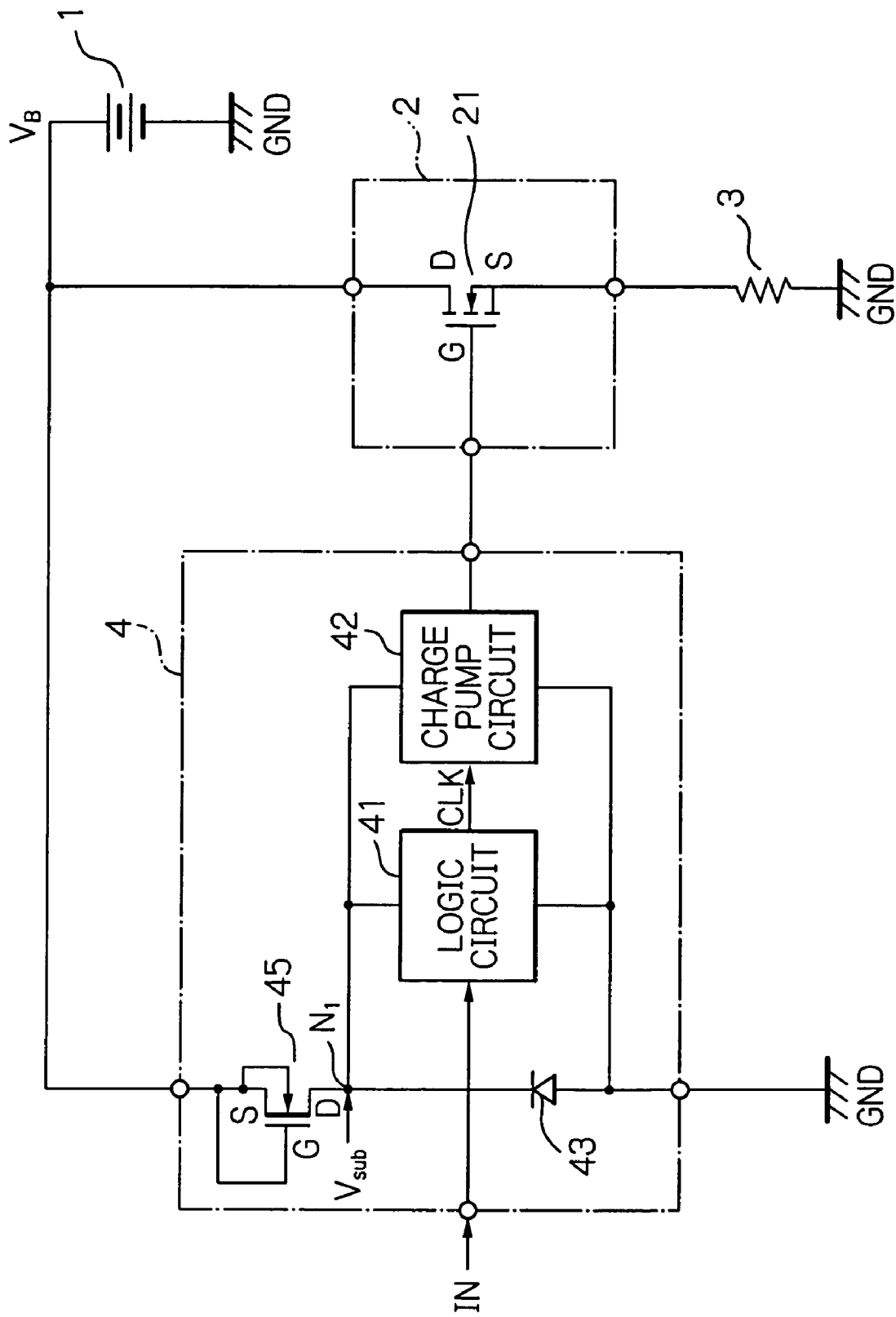
FIG. 2 is a circuit diagram illustrating a first embodiment of the power supply control apparatus according to the present invention.

In FIG. 2, which is a first embodiment of the power supply control apparatus according to the present invention, an N-channel depletion type MOS transistor 45 whose gate G is connected to a source S thereof is provided instead of the resistor 44 of FIG. 1. The N-channel depletion type MOS transistor 45 with no control can be easily integrated into the control circuit 4, thus decreasing the manufacturing cost.

Figure 3:
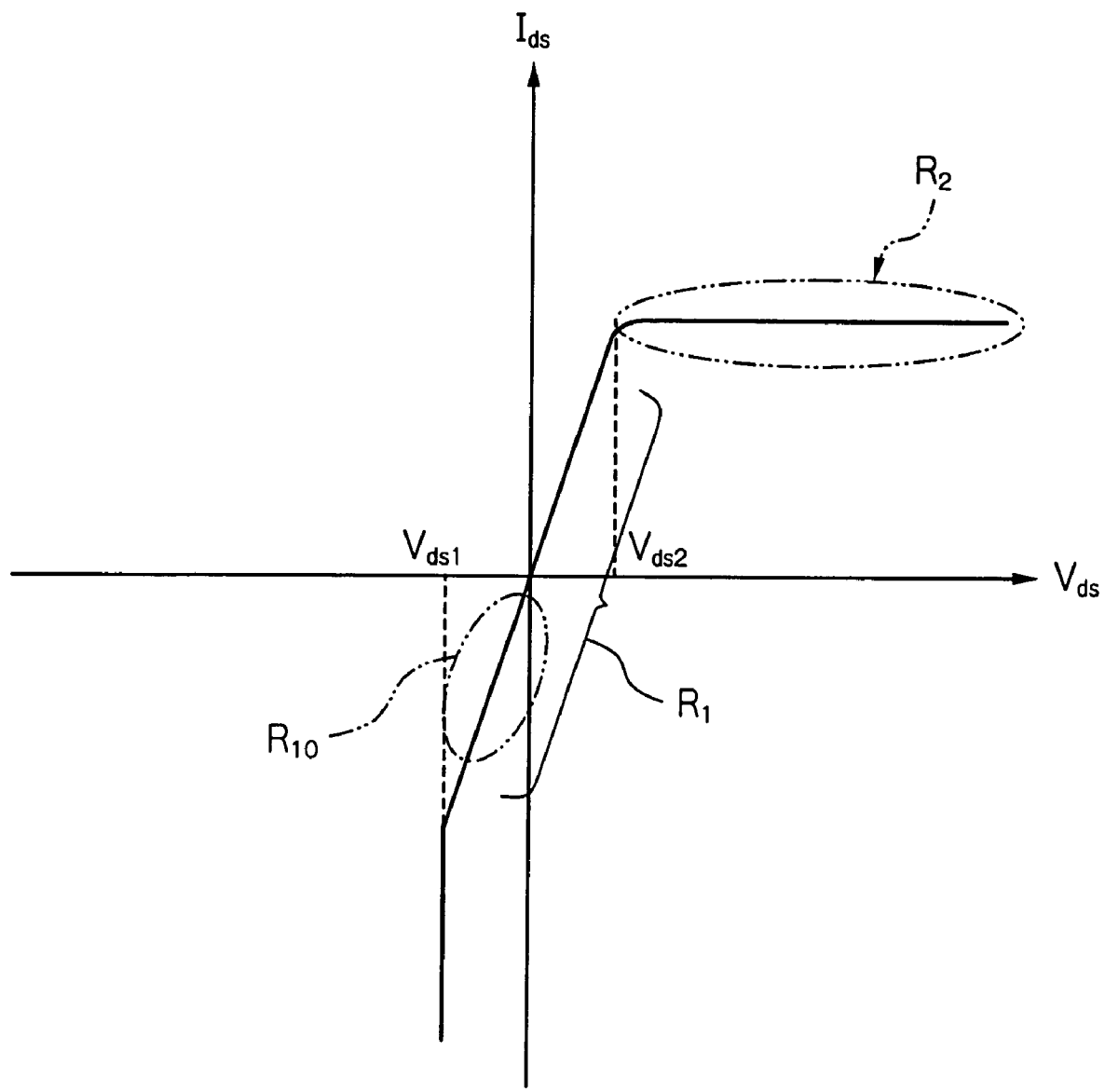
FIG. 3 is a graph showing the drain-to-source current characteristics of the N-channel depletion type MOS transistor of FIG. 2.
Figure 3:
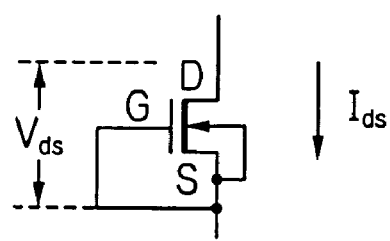

In FIG. 3, which shows the drain-to-source current characteristics of the N-channel depletion type MOS transistor 45 of FIG. 2, the abscissa designates a drain-to-source voltage of the MOS transistor 45, and the ordinate designates a drain-to-source current of the MOS transistor 45. That is, since the gate G is connected to the source S, the drain-to-source current characteristics of FIG. 3 are diode characteristics opposite to the diode characteristics of the parasitic diode 43 with respect to the battery 1. In more detail, in a resistance region $R_1$ where the drain-to-source voltage $V_{ds}$ is relatively small ($V_{ds1} \leq V_{ds} 23 V_{ds2}$), the MOS transistor 45 serves as a resistor. Also, in a saturated region $R_2$ where $V_{ds} > V_{ds2}$, the drain-to-source current $I_{ds}$ is almost constant. Further, when $V_{ds} < V_{ds1}$, the drain-to-source current $I_{ds}$ rapidly increases.

In a forward-connected battery state as illustrated in FIG. 2, use is made of a part $R_{10}$ of the resistance region $R_1$ of FIG. 3. As a result, the parasitic diode 43 is reverse-biased, so that a voltage defined by the parasitic diode 43 is applied to the logic circuit 41 and the charge pump circuit 42, thus normally operating the logic circuit 41 and the charge pump circuit 42.

Figure 4:
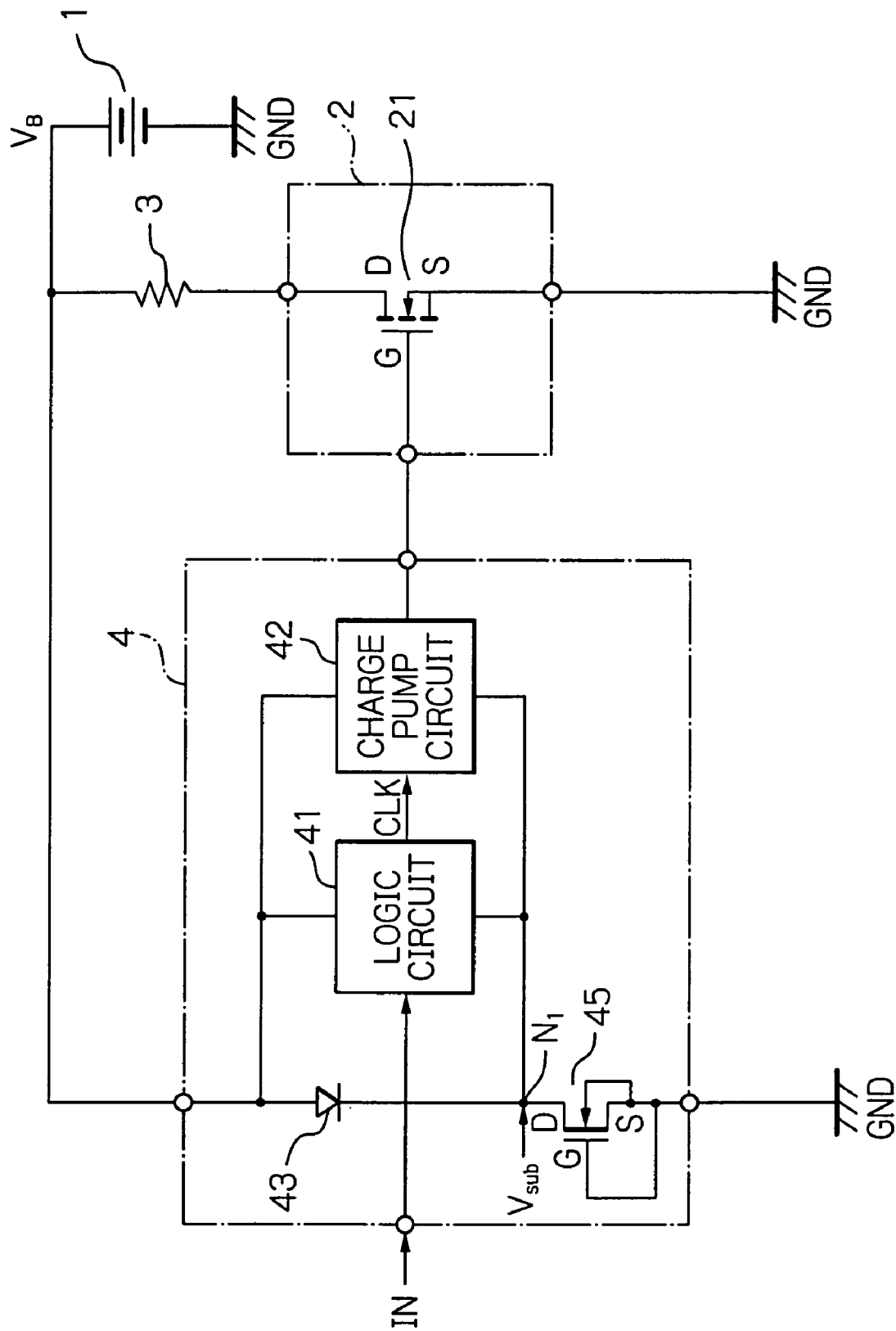
FIG. 4 is a circuit diagram illustrating the power supply control apparatus of FIG. 2 in a reverse-connected battery state.

On the other hand, in a reverse-connected battery state as illustrated in FIG. 4, use is made of the saturated region $R_2$ of FIG. 3. As a result, since the parasitic diode 43 is forward-biased to decrease its resistance value, most of the battery voltage $V_B$ is applied to the MOS transistor 45, while the current flowing through the logic circuit 41 and the charge pump circuit 42 can be suppressed, thus protecting the logic circuit 41 and the charge pump circuit 42 against a reversed voltage of the battery voltage $V_B$. In this case, the charge pump circuit 42 turns ON the power MOS transistor 21.

In FIGS. 2 and 4, note that a total resistance of the power supply switch circuit 4 is set to be lower than a total resistance of the control circuit 4.

The structure of the control circuit 4 of FIG. 2 is explained next with reference to FIG. 5.

Figure 5:
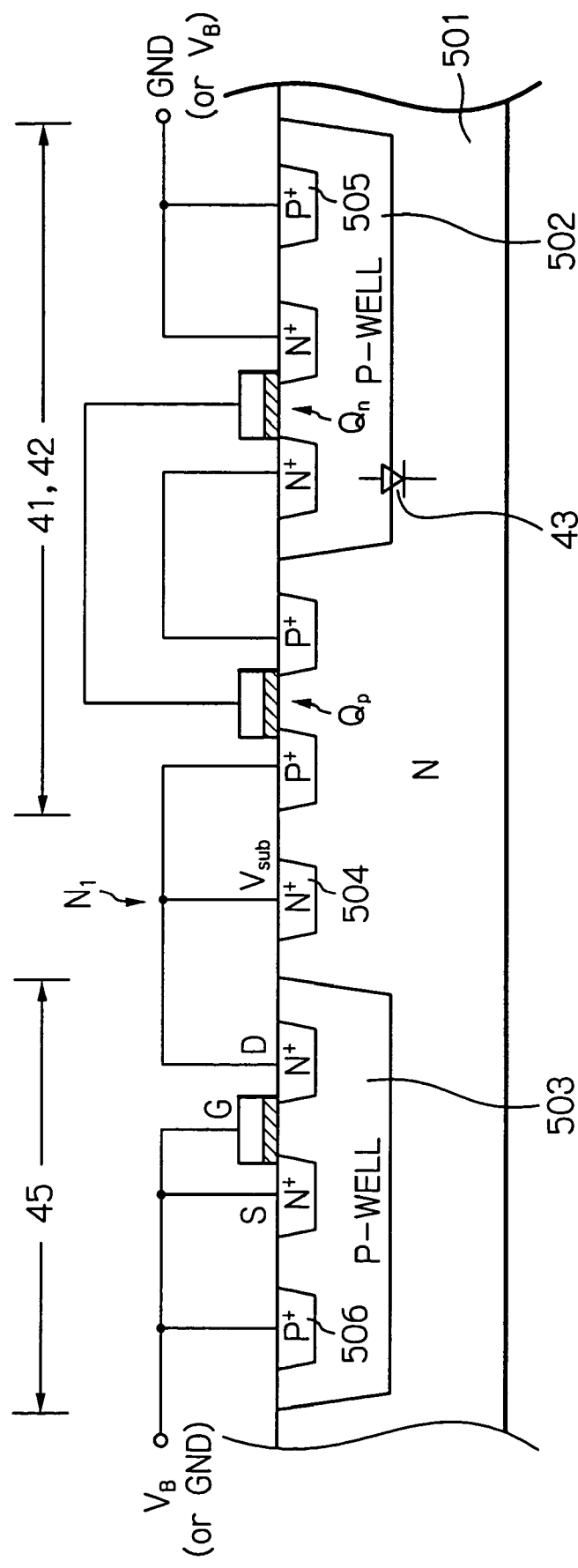
FIG. 5 is a cross-sectional view of the control circuit of FIG. 2.

In FIG. 5, reference numeral 501 designates an N-type monocrystalline silicon substrate in which a P-type well 502 for the N-channel MOS transistors such $Q_n$ of the logic circuit 41 and the charge pump circuit 42 and a P-type well 503 for the N-channel depletion type MOS transistor 45 are formed.

In the substrate 501, the P-channel MOS transistors such as $Q_p$ of the logic circuit 41 and the charge pump circuit 42 are formed. In this case, the node $N_1$ is connected via an $N^+$-type impurity diffusion region 504 to the substrate 501.

In the P-type well 502, the ground voltage GND (or the battery voltage $V_B$) is supplied via a $P^+$-type impurity diffusion region 505 to the P-type well 502, thus stably operating the N-channel MOS transistors such as $Q_n$.

In the P-type well 503, the battery voltage $V_B$ (or the ground voltage GND) is supplied via a $P^+$-type impurity diffusion region 506 to the P-type well 503, thus stably operating the N-channel depletion type MOS transistor 45.

Figure 6:
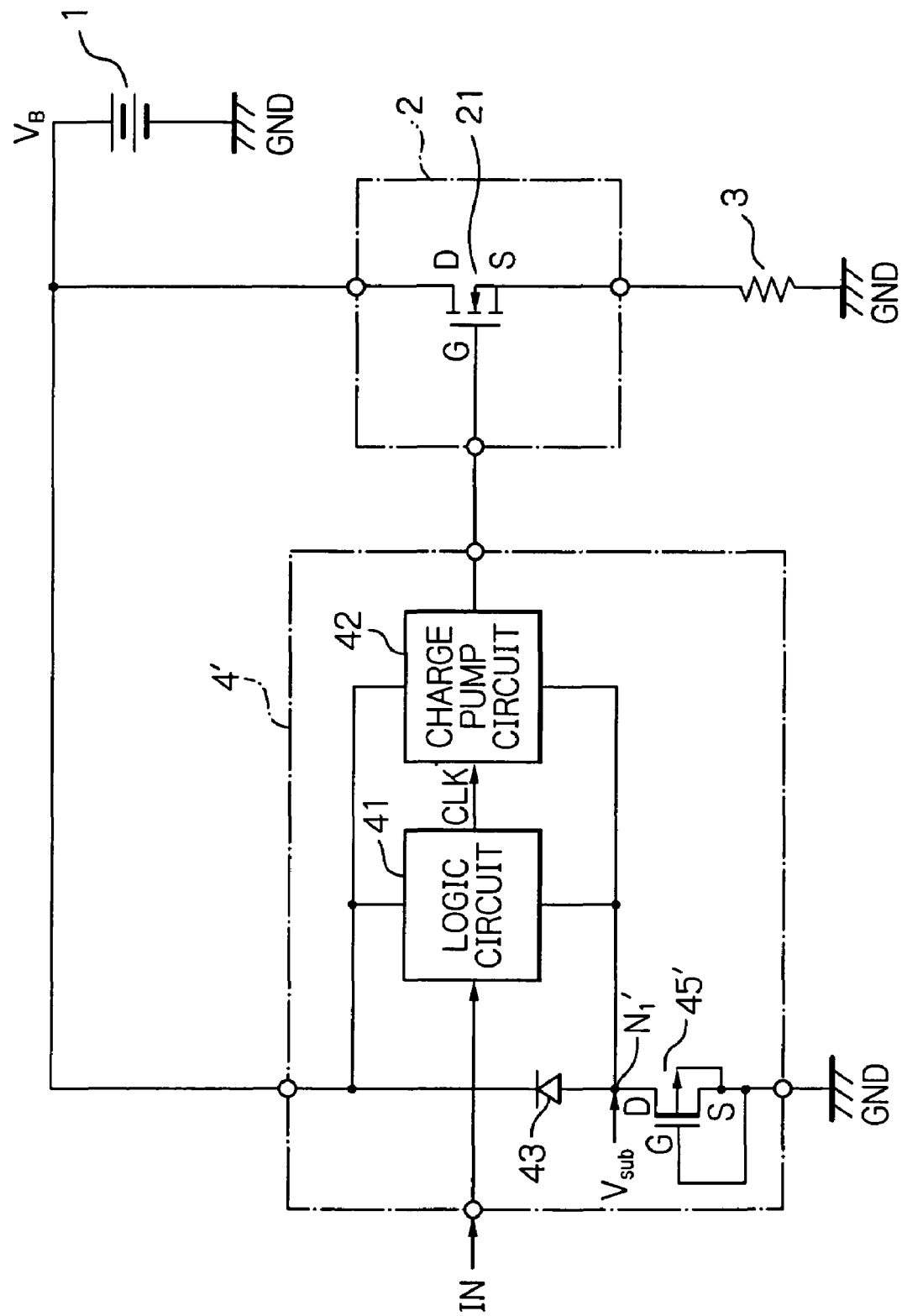
FIG. 6 is a circuit diagram illustrating a second embodiment of the power supply control apparatus according to the present invention.

In FIG. 6, which is a second embodiment of the power supply control apparatus according to the present invention, a P-channel depletion type MOS transistor 45' whose gate G is connected to a source S thereof is provided instead of the N-channel depletion type MOS transistor 45 of FIG. 2. The P-channel depletion type MOS transistor 45' with no control can also be easily integrated into the control circuit 4, thus decreasing the manufacturing cost.

Figure 7:
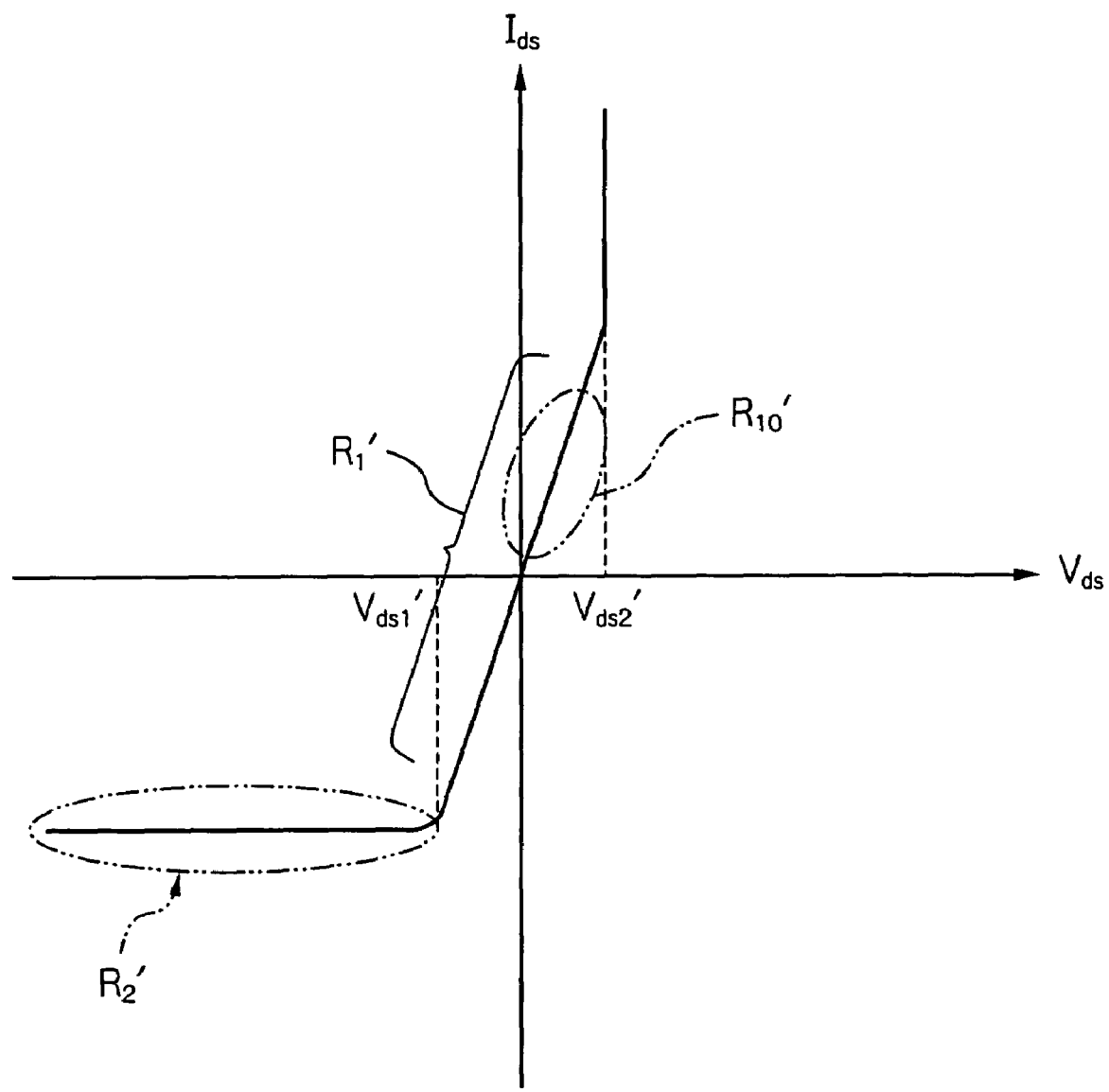
FIG. 7 is a graph showing the drain-to-source current characteristics of the P-channel depletion type MOS transistor of FIG. 6.

In FIG. 7, which shows the drain-to-source current characteristics of the P-channel depletion type MOS transistor 45' of FIG. 6, the abscissa designates a drain-to-source voltage of the MOS transistor 45', and the ordinate designates a drain-to-source current of the MOS transistor 45'. That is, since the gate G is connected to the source S, the drain-to-source current characteristics of FIG. 7 are diode characteristics opposite to the diode characteristics of the parasitic diode 43 with respect to the battery 1. In more detail, in a resistance region $R_1'$ where the drain-to-source voltage $V_{ds}$ is relatively small ($V_{ds1}' \leq V_{ds} \leq V_{ds2}'$), the MOS transistor 45' serves as a resistor. Also, in a saturated region $R_2'$ where $V_{ds} < V_{ds1}'$, the drain-to-source current $I_{ds}$ is almost constant. Further, when $V_{ds} > V_{ds2}'$, the drain-to-source current $I_{ds}$ rapidly increases.

In a forward-connected battery state as illustrated in FIG. 6, use is made of a part $R_{10}$ of the resistance region $R_1'$ of FIG. 7. As a result, the parasitic diode 43 is reverse-biased, so that a voltage defined by the parasitic diode 43 is applied to the logic circuit 41 and the charge pump circuit 42, thus normally operating the logic circuit 41 and the charge pump circuit 42.

Figure 8:
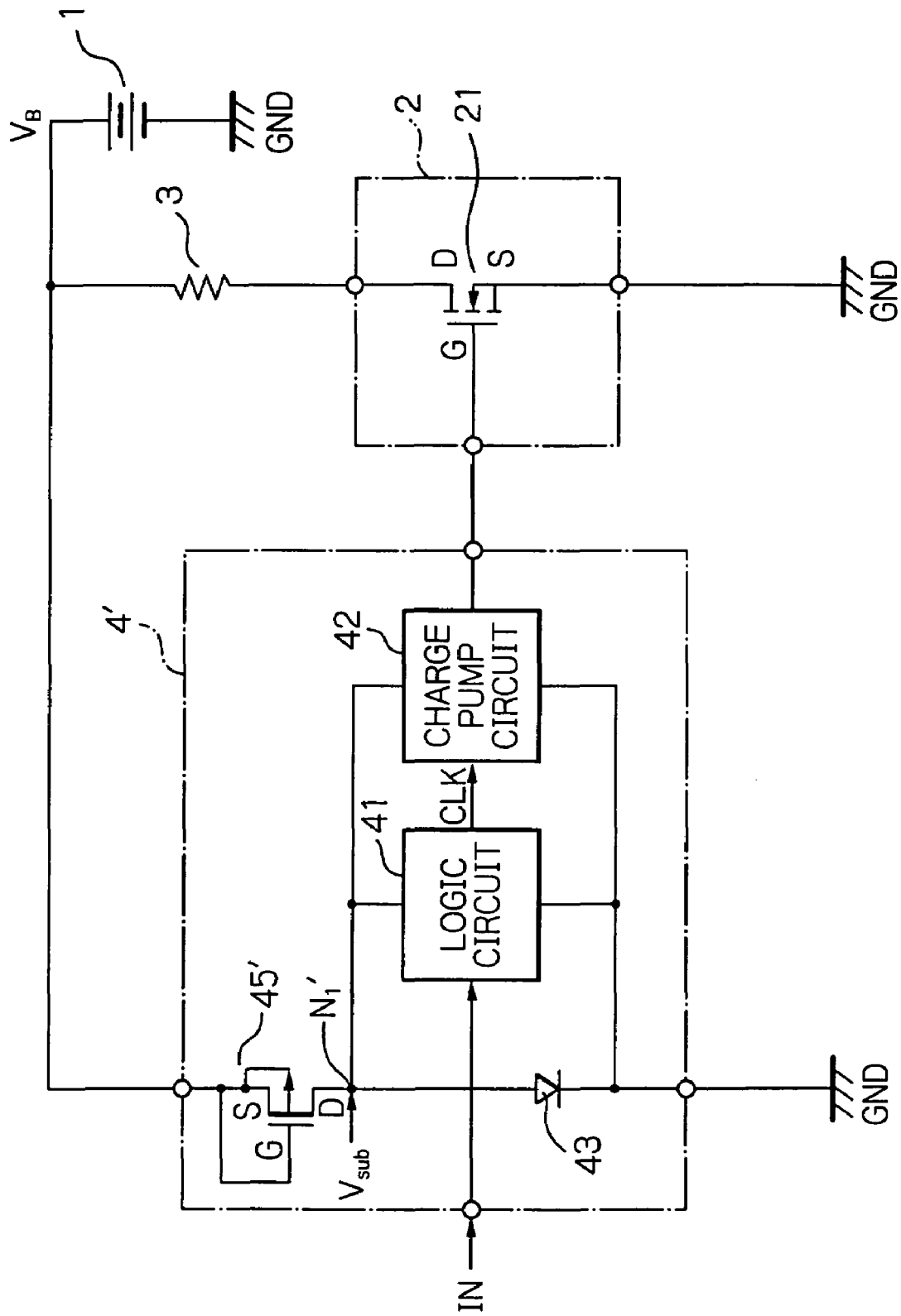
FIG. 8 is a circuit diagram illustrating the power supply control apparatus of FIG. 6 in a reverse-connected battery state.

On the other hand, in a reverse-connected battery state as illustrated in FIG. 8, use is made of the saturated region $R_2'$ of FIG. 7. As a result, since the parasitic diode 43 is forward-biased to decrease its resistance value, most of the battery voltage $V_B$ is applied to the MOS transistor 45', while the current flowing through the logic circuit 41 and the charge pump circuit 42 can be suppressed, thus protecting the logic circuit 41 and the charge pump circuit 42 against a reversed voltage of the battery voltage $V_B$. In this case, the charge pump circuit 42 turns ON the power MOS transistor 21.

Also, in FIGS. 6 and 8, note that a total resistance of the power supply switch circuit 4 is set to be lower than a total resistance of the control circuit 4.

The structure of the control circuit 4 of FIG. 8 is explained next with reference to FIG. 9.

Figure 9:
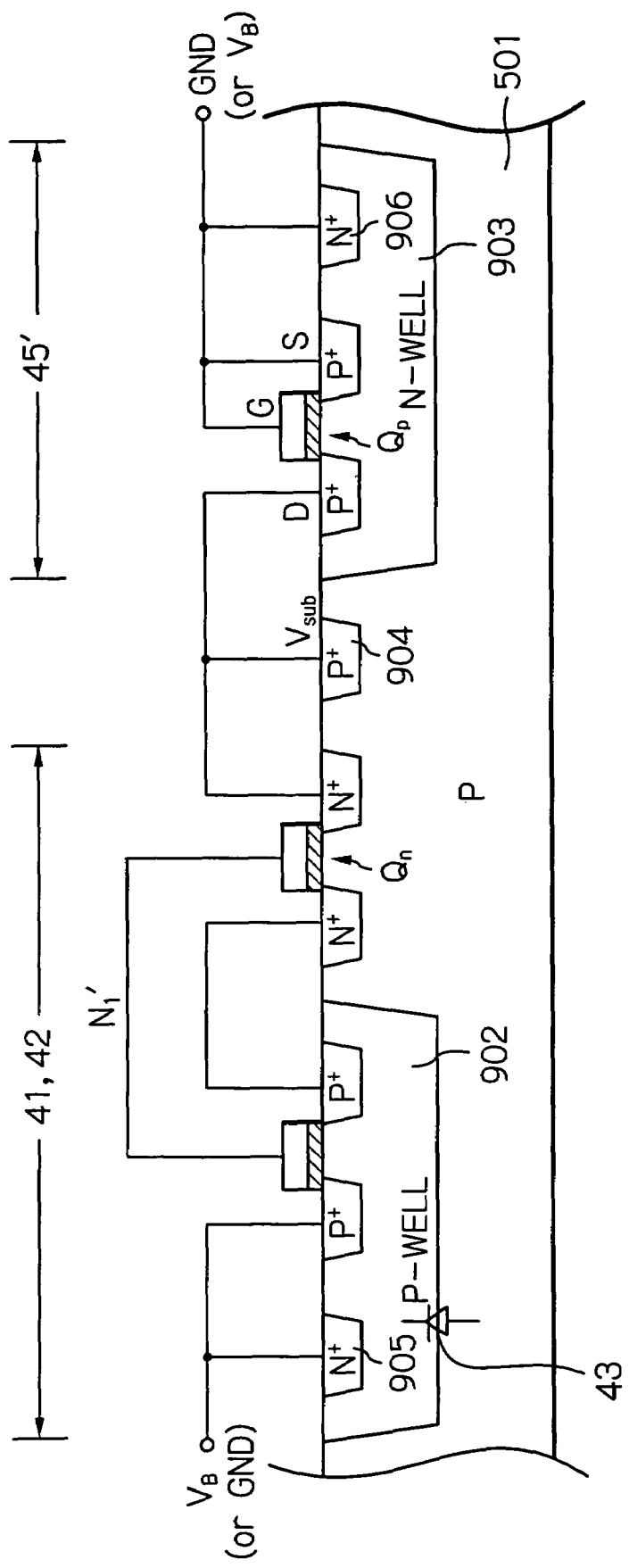
FIG. 9 is a cross-sectional view of the control circuit of FIG. 6.

In FIG. 9, reference numeral 901 designates a P-type monocrystalline silicon substrate in which an N-type well 902 for the P-channel MOS transistors such as $Q_p$ of the logic circuit 41 and the charge pump circuit 42 and an N-type well 903 for the P-channel depletion type MOS transistor 45' are formed.

In the substrate 901, the N-channel MOS transistors such as $Q_n$ of the logic circuit 41 and the charge pump circuit 42 are formed. In this case, the node $N_1'$ is connected via a P$^+$-type impurity diffusion region 904 to the substrate 901.

In the N-type well 902, the ground voltage GND (or the battery voltage $V_B$) is supplied via an N$^+$-type impurity diffusion region 905 to the N-type well 902, thus stably operating the P-channel MOS transistors such as $Q_p$.

In the N-type well 903, the battery voltage $V_B$ (or the ground voltage GND) is supplied via an N$^+$-type impurity diffusion region 906 to the N-type well 903, thus stably operating the P-channel depletion type MOS transistor 45'.

As explained hereinabove, according to the present invention, an internal circuit of a control circuit chip for controlling a power supply switch circuit chip can be protected against a reverse voltage of a reverse-connected battery state by integrating a deletion-type MOS transistor having diode characteristics into the control circuit chip.

The invention claimed is:

1. A power supply control apparatus, comprising:
a first power supply terminal and a second power supply terminal between which a power voltage is supplied;
a control circuit coupled between the first power supply terminal and the second power supply terminal and producing a control signal, the control circuit being formed in a semiconductor substrate as a CMOS circuit;
a power device turned on and off in response to the control signal to control a power supply to a load; and
a depletion type MOS transistor inserted between the control circuit and the first power supply terminal, the depletion type MOS transistor being formed in a well region that is selectively formed in the semiconductor substrate, the depletion type MOS transistor having a source region and a drain region selectively formed in the well region and a gate electrode formed on a gate insulating film covering a channel region between the source and drain regions, one of the source region and drain region, the well region and the gate electrode being connected to the first power supply terminal and the other of the source and drain regions being connected to the semiconductor substrate and the control circuit,
wherein the depletion type MOS transistor representing a first resistance characteristic when the power supply is connected between the first and second power supply terminals in a forward-connected state and a constant current characteristic when the power supply is connected between the first and second power supply terminals in a reverse-connected state, thereby providing a second resistance characteristic.

2. The apparatus as claimed in claim 1, wherein the CMOS circuit includes an additional well region selectively formed in the semiconductor substrate, the additional well region being connected to the second power supply terminal.

3. The apparatus as claimed in claim 1, wherein the power device comprises a power MOS transistor of an N-channel type and the depletion type MOS transistor comprises an N-channel type, the power MOS transistor having a gate electrode supplied with the control signal, a first electrode connected to the first power supply terminal, and a second electrode connected to the load.

4. The apparatus as claimed in claim 1, wherein the power device comprises a power MOS transistor of an N-channel type and the depletion type MOS transistor comprises a P-channel type, the power MOS transistor having a gate electrode supplied with the control signal, a first electrode connected to the first power supply terminal, and a second electrode connected to the load.

* * * * *